US009190418B2

(12) United States Patent
Chou et al.

(10) Patent No.: US 9,190,418 B2
(45) Date of Patent: Nov. 17, 2015

(54) JUNCTION BUTTING IN SOI TRANSISTOR WITH EMBEDDED SOURCE/DRAIN

(71) Applicant: International Business Machines Corporation, Armonk, NY (US)

(72) Inventors: Anthony I. Chou, Beacon, NY (US); Murshed M. Chowdhury, Newburgh, NY (US); Arvind Kumar, Chappaqua, NY (US); Robert R. Robison, Colchester, VT (US)

(73) Assignee: GLOBALFOUNDRIES U.S. 2 LLC, Hopewell Junction, NY (US)

( * ) Notice: Subject to any disclaimer, the term of this patent is extended or adjusted under 35 U.S.C. 154(b) by 0 days.

(21) Appl. No.: 14/217,572

(22) Filed: Mar. 18, 2014

(65) Prior Publication Data
US 2015/0270284 A1   Sep. 24, 2015

(51) Int. Cl.
| | |
|---|---|
| H01L 21/76 | (2006.01) |
| H01L 27/12 | (2006.01) |
| H01L 29/66 | (2006.01) |
| H01L 21/84 | (2006.01) |
| H01L 21/324 | (2006.01) |
| H01L 21/225 | (2006.01) |
| H01L 21/265 | (2006.01) |
| H01L 29/167 | (2006.01) |

(52) U.S. Cl.
CPC .......... H01L 27/1203 (2013.01); H01L 21/225 (2013.01); H01L 21/265 (2013.01); H01L 21/324 (2013.01); H01L 21/84 (2013.01); H01L 29/167 (2013.01); H01L 29/6656 (2013.01); H01L 29/66636 (2013.01)

(58) Field of Classification Search
CPC .. H01L 27/1203; H01L 21/265; H01L 21/324
USPC .......................................... 438/429; 257/368
See application file for complete search history.

(56) References Cited

U.S. PATENT DOCUMENTS

| | | | |
|---|---|---|---|
| 8,017,487 B2 * | 9/2011 | Chong et al. ................... | 438/300 |
| 2007/0252204 A1 | 11/2007 | Wei et al. | |
| 2009/0221123 A1 | 9/2009 | Griebenow et al. | |
| 2010/0025743 A1 | 2/2010 | Hoentschel et al. | |
| 2010/0193882 A1 * | 8/2010 | Hoentschel et al. .......... | 257/410 |
| 2012/0205716 A1 * | 8/2012 | Adam et al. ................... | 257/192 |

OTHER PUBLICATIONS

Hsu, et al., "Insulating Halos to Boost Planar NMOSFET Performance", IEEE Transactions on Electron Devices, Oct. 2010, vol. 57, No. 10.

Jurczak, et al., "Dielectric Pockets—A New Concept of the Junctions for Deca-Nanometric CMOS Devices", IEEE Transactions on Electron Devices, Aug. 2001, vol. 48, No. 8.

* cited by examiner

*Primary Examiner* — Bradley K Smith
(74) *Attorney, Agent, or Firm* — Scully, Scott, Murphy & Presser, P.C.

(57) ABSTRACT

After forming source/drain trenches within a top semiconductor layer of a semiconductor-on-insulator (SOI) substrate, portions of the trenches adjacent channel regions of a semiconductor structure are covered either by sacrificial spacers formed on sidewalls of the trenches or by photoresist layer portions. The sacrificial spacers or photoresist layer portions shield portions of the top semiconductor layer underneath the trenches from subsequent ion implantation for forming junction butting. The ion implantation regions thus are confined only in un-shielded, sublayered portions of the top semiconductor layer that are away from the channel regions of the semiconductor structure. The width of the ion implantation regions are controlled such that the implanted dopants do not diffuse into the channel regions during subsequent thermal cycles so as to suppress the short channel effects.

20 Claims, 7 Drawing Sheets

JUNCTION BUTTING IN SOI TRANSISTOR WITH EMBEDDED SOURCE/DRAIN

BACKGROUND

The present disclosure relates to semiconductor device fabrication. More particularly, the present disclosure relates to methods of forming well-controlled junction butting in semiconductor-on-insulator field effect transistors with an embedded source and an embedded drain.

Embedded source/drain techniques have been widely used to improve charge carrier mobility as channel lengths of semiconductor-on-insulator (SOI) field effect transistors (FETs) are scaled down to the sub-50-nm range. Embedded source/drain techniques typically include removing the source region and the drain region that are present in a semiconductor substrate to form trenches followed by epitaxially growing a semiconductor material in the trenches.

SOI FETs with an embedded source region and an embedded drain region (collectively referred to herein after as "embedded source/drain regions") require junction butting to ensure low junction capacitance and to avoid cross-talk between adjacent FETs. To provide adequate junction butting, ion implantation of appropriate dopants through the bottom of the trenches is typically performed. However, the trenches do not provide any control over the lateral placement and spread of implanted dopants. Subsequent thermal cycles diffuse the implanted dopants to the channel regions of SOI FETs, creating undesired effects, such as short channel effects and low backside threshold voltage, which in turn result in backside conduction. As such, there remains a need to develop methods that can provide better control over the junction butting in SOI FETs with embedded source/drain regions.

SUMMARY

The present disclosure provides methods of forming well-controlled junction butting in SOI FETs with an embedded source region and an embedded drain region. After forming source/drain trenches within a top semiconductor layer of a SOI substrate, portions of the trenches adjacent channel regions of a semiconductor structure are covered either by sacrificial spacers formed on sidewalls of the trenches or by photoresist layer portions. The sacrificial spacers or photoresist layer portions shield portions of the top semiconductor layer underneath the trenches from subsequent ion implantation for forming junction butting. The ion implantation regions thus are confined only in un-shielded, sublayered portions of the top semiconductor layer that are away from the channel regions of the semiconductor structure. The width of the ion implantation regions are controlled such that the implanted dopants do not diffuse into the channel regions during subsequent thermal cycles so as to suppress the short channel effects.

In one aspect of the present disclosure, a method of forming a semiconductor structure is provided.

In one embodiment, the method of forming a semiconductor structure includes first forming a plurality of gate structures on a top semiconductor layer of a SOI substrate. Trenches are then formed in the top semiconductor layer between the gate structures. The trenches extend through a portion of the top semiconductor layer. Next sacrificial spacers are formed on sidewalls of the gate structures and trenches. The sacrificial spacers shield portions of the top semiconductor layer underneath the sacrificial spacers. Dopants are introduced into un-shielded portions of the top semiconductor layer underneath the trenches to form doped regions in the top semiconductor layer. The doped regions contact a buried insulator layer of the SOI substrate. The sacrificial spacers are removed to expose undoped portions of the top semiconductor layer beneath the trenches. Epitaxial semiconductor regions are formed in the trenches.

In another embodiment, the method of forming a semiconductor structure includes first forming a plurality of gate structures on a top semiconductor layer of a SOI substrate. Trenches are then formed in the top semiconductor layer between the gate structures. The trenches extend through a portion of the top semiconductor layer. Next, a photoresist layer is formed on the gate structures and the top semiconductor layer. Openings are formed in the photoresist layer. The openings expose portions of the top semiconductor layer underneath the trenches. Remaining portions of the photoresist layer space the openings laterally away from the gate structures. Dopants are introduced into the exposed portions of the top semiconductor layer to form doped regions in the top semiconductor layer. The doped regions contact a buried insulator layer of the SOI substrate. After removing the remaining portions of the photoresist layer, doped epitaxial semiconductor regions are formed in the trenches.

In another aspect of the present disclosure, a semiconductor structure is provided. The semiconductor structure includes a plurality of gate structures on a top semiconductor layer of a SOI substrate. The semiconductor structure further includes epitaxial semiconductor regions embedded in the top semiconductor layer on opposite sides of each gate structure. The epitaxial semiconductor regions extend from a top surface of the top semiconductor layer into the top semiconductor layer and comprise a first dopant. The semiconductor structure further includes junction butting regions underneath a bottom surface of each epitaxial semiconductor region and in contact with a buried insulator layer of the SOI substrate. The junction butting regions comprises a second dopant. Yet further, the semiconductor structure includes semiconductor channel regions located beneath the gate structures and between the epitaxial semiconductor regions. The channel regions are substantially free of the second dopant present in the junction butting regions.

DETAILED DESCRIPTION

Figure 1:
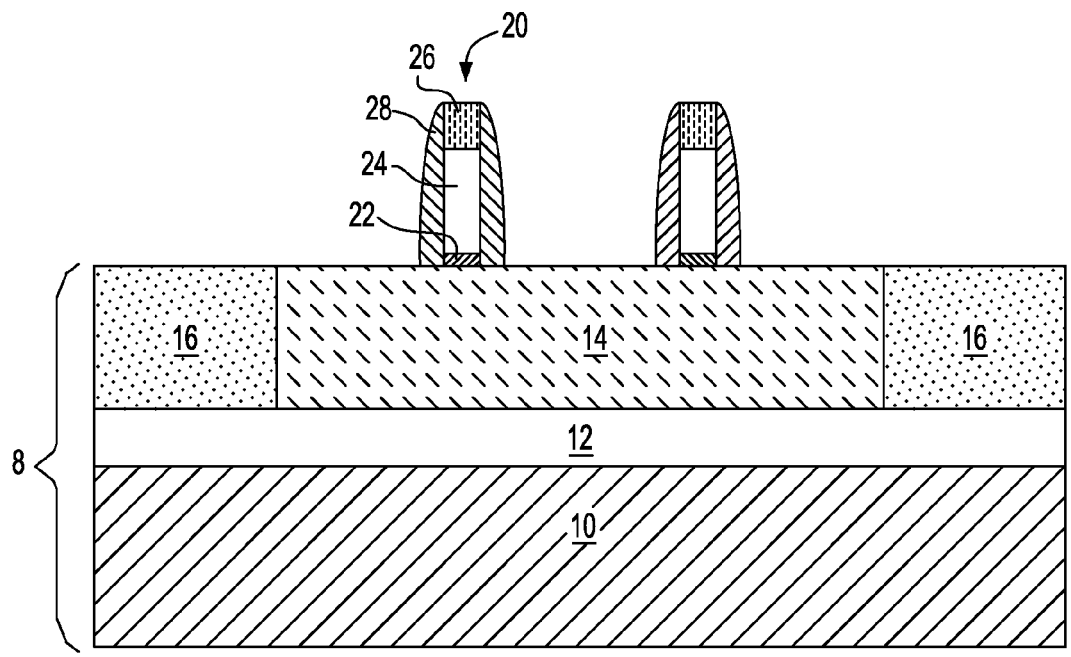
FIG. 1 is a cross-sectional view of an initial semiconductor structure including a pair of gate structures located on an upper surface of a semiconductor substrate that can be employed in embodiments of the present disclosure.

The present disclosure will now be described in greater detail by referring to the following discussion and drawings that accompany the present disclosure. It is noted that the drawings of the present disclosure are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present disclosure. However, it will be appreciated by one of ordinary skill in the art that the various embodiments of the present disclosure may be practiced without these specific details. In other instances, well-known structures or processing steps have not been described in detail in order to avoid obscuring the present disclosure.

Referring to FIG. 1, there is illustrated an initial semiconductor structure that can be employed in embodiments of the present disclosure. Specifically, FIG. 1 illustrates an initial structure that includes a semiconductor substrate 8 having a pair of gate structures 20 formed thereupon. The semiconductor substrate 8 is a semiconductor-on-insulator (SOI) substrate that includes a bottom semiconductor layer 10, a buried insulator layer 12, and a top semiconductor layer 14. Although a pair of gate structures 20 is described and illustrated, the present disclosure is not limited to such a number of gate structures. Instead, a plurality of gate structures 20 can be formed upon a portion of the top semiconductor layer 14 of the semiconductor substrate 8.

Each of the bottom semiconductor layer 10 and the top semiconductor layer 14 comprises a semiconductor material such as, for example, Si, Ge, SiGe, SiC, SiGeC, and III/IV compound semiconductors such as, for example, InAs, GaAs, and InP. The semiconductor material of the bottom semiconductor layer 10 and the top semiconductor layer 14 may be the same, or different. Typically, each of the bottom semiconductor layer 10 and the top semiconductor layer 14 comprises a single crystalline semiconductor material. For example, the single crystalline semiconductor material may be Si.

The thickness of the bottom semiconductor layer 10 is typically from 400 μm to 1,000 μm, and typically from 50 μm to 900 μm.

The thickness of the top semiconductor layer 14 may be from 10 nm to 200 nm, with a thickness from 30 nm to 70 nm being more typical. In some embodiments, and when an ETSOI (extremely thin semiconductor-on-insulator) substrate is employed, the top semiconductor layer 14 can have a thickness of less than 10 nm. If the thickness of the top semiconductor layer 14 is not within one of the above mentioned ranges, a thinning step such as, for example, planarization or etching can be used to reduce the thickness of top semiconductor layer 14 to a value within one of the ranges mentioned above. The top semiconductor layer 14 may be implanted with dopants of p-type or n-type.

The buried insulator layer 12 comprises a dielectric material such as silicon oxide, silicon nitride, silicon oxynitride, or a combination thereof. The thickness of the buried insulator layer 12 may be from 1 nm to 200 nm, with a thickness from 100 nm to 150 nm being more typical.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the top semiconductor layer 14 to a layer having a thickness that is more desirable.

Shallows trench isolation (STI) regions 16 can be formed in the top semiconductor layer 14 to provide electrical isolation between neighboring semiconductor regions (not shown). The STI regions 16 can be formed utilizing a conventional trench isolation process. For example, lithography, etching and filling of the trench with a trench dielectric such as an oxide may be used in forming the STI regions 16. Optionally, a liner may be formed in the trench prior to trench fill, a densification step may be performed after the trench fill and a planarization process may follow the trench fill as well.

Each gate structure 20 includes a gate stack (22, 24, 26) and gate spacers 28. The gate stack (22, 24, 26) includes a gate dielectric 22, a gate conductor 24 and a gate cap dielectric 26. The gate stack (22, 24, 26) can be formed by patterning a stack of gate level layers (not shown) including, from bottom to top, a gate dielectric layer, a gate conductor layer and a gate cap dielectric layer by an anisotropic etch process employing a patterned photoresist (not shown) as a masking layer.

The gate dielectric 22 can include any gate insulating material such as, for example, an oxide, a nitride, an oxynitride or a multilayered stack thereof. In some embodiments, the gate dielectric 22 is a semiconductor oxide, a semiconductor nitride or a semiconductor oxynitride. In other embodiments, the gate dielectric 22 includes a dielectric metal oxide having a dielectric constant that is greater than the dielectric constant of silicon oxide, e.g., 3.9. Typically, the gate dielectric 22 that is employed has a dielectric constant greater than 4.0, with a dielectric constant of greater than 8.0 being more typical. Such dielectric materials are referred to herein as a high-k dielectric material. Examples of high-k dielectric material include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Multilayered stacks of these high-k dielectric materials can also be employed as the gate dielectric 22. Each value of x is independently from 0.5 to 3 and each value of y is independently from 0 to 2.

The gate dielectric 22 can be formed by methods well known in the art. In one embodiment, the gate dielectric 22 can be formed by a deposition process such as, for example, chemical vapor deposition (CVD), physical vapor deposition (PVD), molecular beam deposition (MBD), pulsed laser deposition (PLD), liquid source misted chemical deposition (LSMCD) and atomic layer deposition (ALD). Alternatively, the gate dielectric 22 can be formed by a thermal process such as, for example, thermal oxidation and/or thermal nitridation of a top portion of the top semiconductor layer 14.

The gate dielectric 22 can have a thickness from 1 nm to 10 nm, with a thickness from 2 nm to 5 nm being more typical. When a high-k gate dielectric is employed as the gate dielectric 22, the high-k gate dielectric can have an effective oxide thickness on the order of, or less than, 1 nm.

The gate conductor 24 comprises any conductive material including, but not limited to, polycrystalline silicon, polycrystalline silicon germanium, an elemental metal, (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) and multilayered combinations thereof. In one embodiment, the gate conductor 24 is comprised of polycrystalline silicon. The polysilicon gate can be used alone, or in conjunction with another conductive material such as, for example, a metal gate conductor material and/or a metal silicide gate conductor material.

The gate conductor 24 can be formed utilizing a conventional deposition process including, for example, CVD, plasma enhanced chemical vapor deposition (PECVD), evaporation, PVD, sputtering, chemical solution deposition and ALD. When silicon-containing materials are used as the gate conductor 24, the silicon-containing materials can be doped with an appropriate impurity by utilizing either an in-situ doping deposition process or by utilizing deposition, followed by a step such as ion implantation or gas phase doping in which the appropriate impurity is introduced into the silicon-containing material. When a metal silicide is formed, a conventional silicidation process is employed.

The gate conductor 24 typically has a thickness from 10 nm to 100 nm, with a thickness from 20 nm to 50 nm being even more typical.

The gate cap dielectric 26 includes a dielectric material such as an oxide, a nitride, an oxynitride or a multilayered stack thereof. In one embodiment, the gate cap dielectric 26 is comprised of silicon nitride. The gate cap dielectric 26 can be formed utilizing a conventional deposition process well known to those skilled in the art including, for example, CVD and PECVD. The thickness of the gate cap dielectric 26 can be from 5 nm to 200 nm, with a thickness from 10 nm to 50 nm being more typical. The gate cap dielectric 26 is optional and may be omitted in some embodiments.

Subsequently, gate spacers 28 can be formed on opposite sidewalls of each gate stack (22, 24, 26). The gate spacers 28 include any dielectric material such as, for example, an oxide, a nitride, an oxynitride or any combination thereof. Typically, but not necessarily always, the gate spacers 28 are comprised of a different material than the gate cap dielectric 26. In one embodiment, the gate spacers 28 are comprised of silicon oxide or silicon nitride.

The gate spacers 28 can be formed utilizing processes that are well known to those skilled in the art. In one embodiment, the gate spacers 28 can be formed by deposition of a conformal layer of a gate spacer material (not shown) over the gate stack (22, 24, 26) and the uppermost surface of the semiconductor substrate 10, followed by an anisotropic etch. In another embodiment, the gate spacers 28 can be formed by conversion of surface portions of a semiconductor material at the sidewalls of the gate conductor 24 by, for example, thermal oxidation, thermal nitridation, plasma oxidation, plasma nitridation, or a combination thereof.

The width of the gate spacers 28, as measured at the base contacting the top semiconductor layer 14, can typically from 2 nm to 50 nm, with a width from 5 nm to 15 nm being more typical. The gate spacers 28 are optional and can be omitted in some embodiments. The combination of the gate stack (22, 24, 26) and if present, the gate spacers 28 constitutes a gate structure 20.

Figure 2:
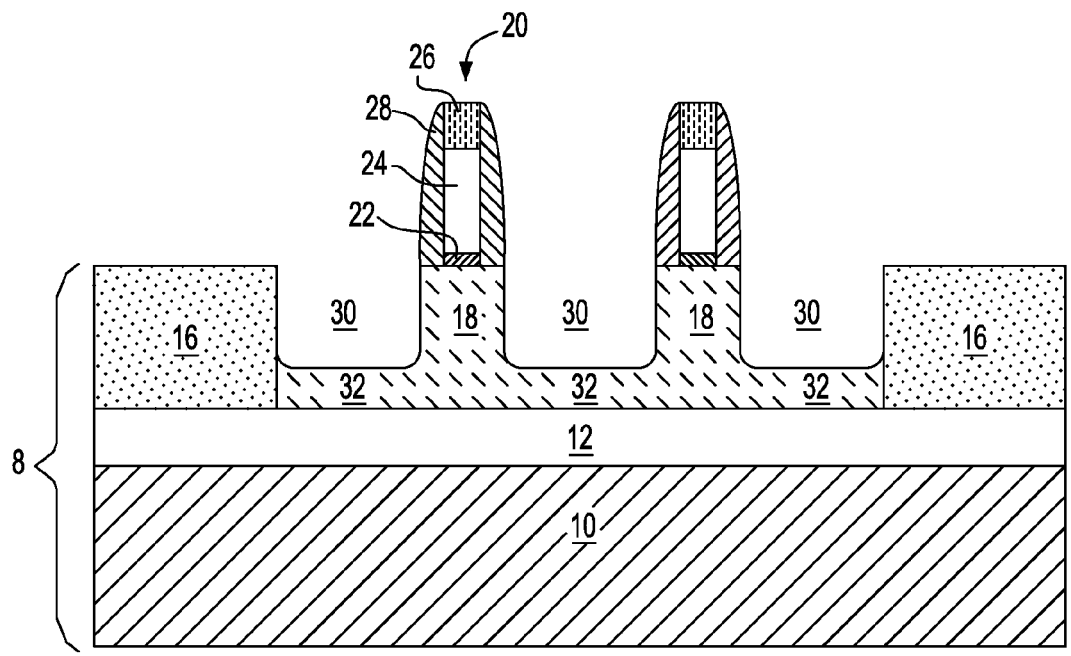
FIG. 2 is a cross-sectional view of the semiconductor structure of FIG. 1 after forming source/drain trenches in a top semiconductor layer of the semiconductor substrate.

Referring to FIG. 2, trenches (i.e., a source trench and a drain trench) 30 are formed by recessing the top semiconductor layer 14 of the semiconductor substrate 10 between the gate structures 20 and between the gate structures 20 and the STI regions 16. The trenches 30 can be formed by etching into the top semiconductor layer 14 by an anisotropic etching such as a reactive ion etch (RIE) employing the combination of the gate structures 20 and the STI regions 16 as an etch mask. The etching process selectively removes exposed portions of the top semiconductor layer 14 that are not protected by the gate structures 20 and the STI regions 16. The shape of the trenches 30 can be optimized for performance and yield. Sidewalls of the trenches 30 can be vertically coincident with outer sidewalls of the gate spacers 28.

The trenches 30 that are formed do not extend to the buried insulator layer 12, i.e., the bottom of each trench 30 is located above a top surface of the buried insulator layer 12, so regions 32 of the top semiconductor layer 14 are present between the bottom of each of the trenches 30 and the top surface of the buried insulator layer 12. Regions 32 can have a thickness from 10 nm to 20 nm. Portions of the top semiconductor layer 14 that are located beneath the gate structures 20 and between the trenches 30 that are employed for forming embedded source regions and drain regions are referred herein as channel regions 18.

Figure 3:
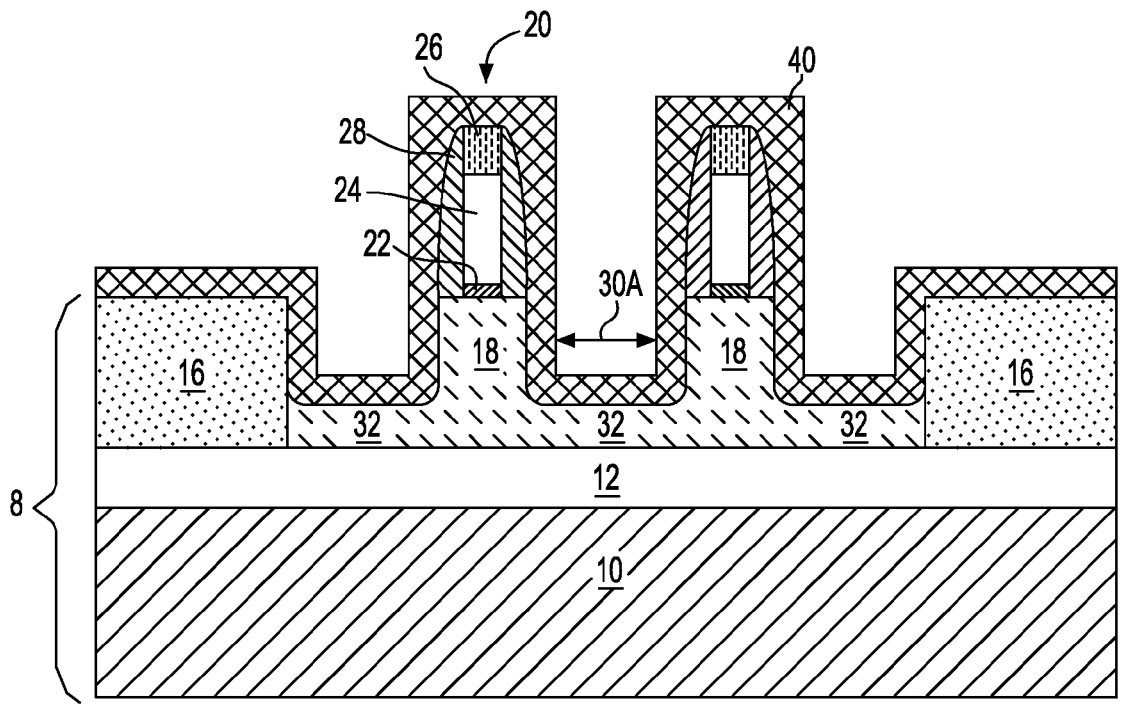
FIG. 3 is a cross-sectional view of a first exemplary semiconductor structure that can be derived from the semiconductor structure of FIG. 2 after forming a sacrificial spacer material layer in accordance with an embodiment of the present disclosure.

Referring to FIG. 3, a first exemplary semiconductor structure can be derived from the semiconductor structure of FIG. 2 after forming a sacrificial spacer material layer 40. The sacrificial spacer material layer 40 can be formed by conformally depositing a sacrificial spacer material over the gate structures 20 and the top semiconductor layer 14 by a conformal deposition process, such as, for example, CVD or ALD. The thickness of the sacrificial spacer material layer 40 is adjusted to ensure that a subsequent ion implantation is kept away from the channel regions 18. The remaining portions of the trenches 30 are herein referred to as 30A.

The sacrificial spacer material layer 40 includes a material that can be removed selective to the materials of the top semiconductor layer 14, the STI regions 16, the gate cap dielectric 26 and the gate spacers 28. In one embodiment, the sacrificial spacer material layer 40 is composed of a semiconductor material such as germanium, Ge, or a silicon germanium alloy including Ge at an atomic concentration greater than 20%. In another embodiment, the sacrificial spacer material layer 40 can include a dielectric material such as an organosilicate glass or other porous or non-porous dielectric materials that are different from the dielectric materials of the STI regions 16, the gate cap dielectric 26 and the gate spacers 28. For example, when the STI regions 16, the gate cap dielectric 26 and the gate spacers 28 include silicon oxide and/or silicon nitride, the sacrificial spacer material layer 40 can include organosilicate glass; and when the shallow STI regions 16, the gate cap dielectric 26 and the gate spacers 58 include silicon oxide, the disposable material layer 40 can include silicon nitride, or vice versa.

Figure 4:
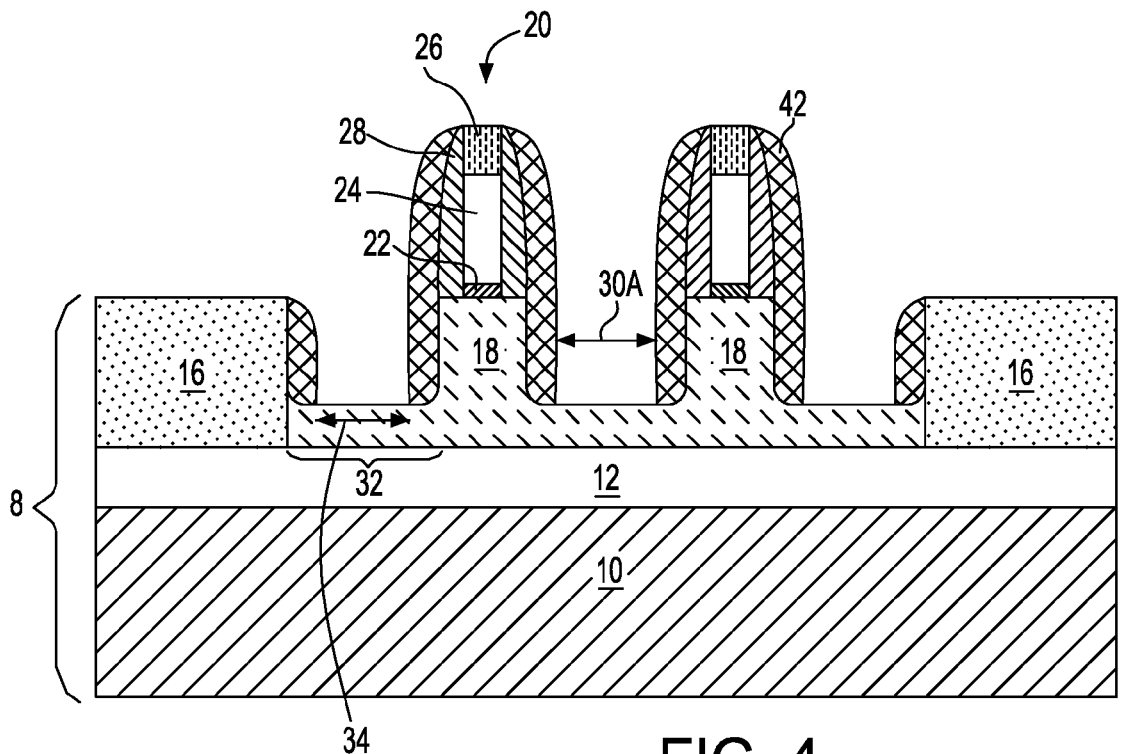
FIG. 4 is a cross-sectional view of the first exemplary semiconductor structure of FIG. 3 after forming sacrificial spacers.

Referring to FIG. 4, there is illustrated the first exemplary semiconductor structure of FIG. 3 after forming sacrificial spacers 42. The sacrificial spacers 42 can be formed by removing horizontal portions of the sacrificial spacer material layer 40 utilizing an anisotropic etching, such as, for example, a RIE. Remaining vertical portions of the sacrificial spacer material layer 40 constitute the sacrificial spacers 42. Removal of horizontal portions of the sacrificial spacer material layer 40 re-exposes portions of regions 32 for subsequent junction butting ion implantation. The exposed portions of regions 32 are herein referred to as implantation regions 34. The width of the sacrificial spacers 42, as measured at the base contacting the bottoms of the trenches 30A, can be from 5 nm to 20 nm.

The widths of the implantation regions 34 that are defined by the sacrificial spacers 42 are selected such that dopants introduced therein during a subsequent ion implantation essentially do not diffuse into the channel regions 18 during the post epitaxial deposition and subsequent thermal cycles, i.e., the channel regions 18 are substantially free of the implanted dopants. The terms "substantially free of the dopants" as used herein means that the dopant concentration is less than $1 \times 10^{18}$ atoms/cm$^3$. As a result, short channel effects are suppressed.

Figure 5:
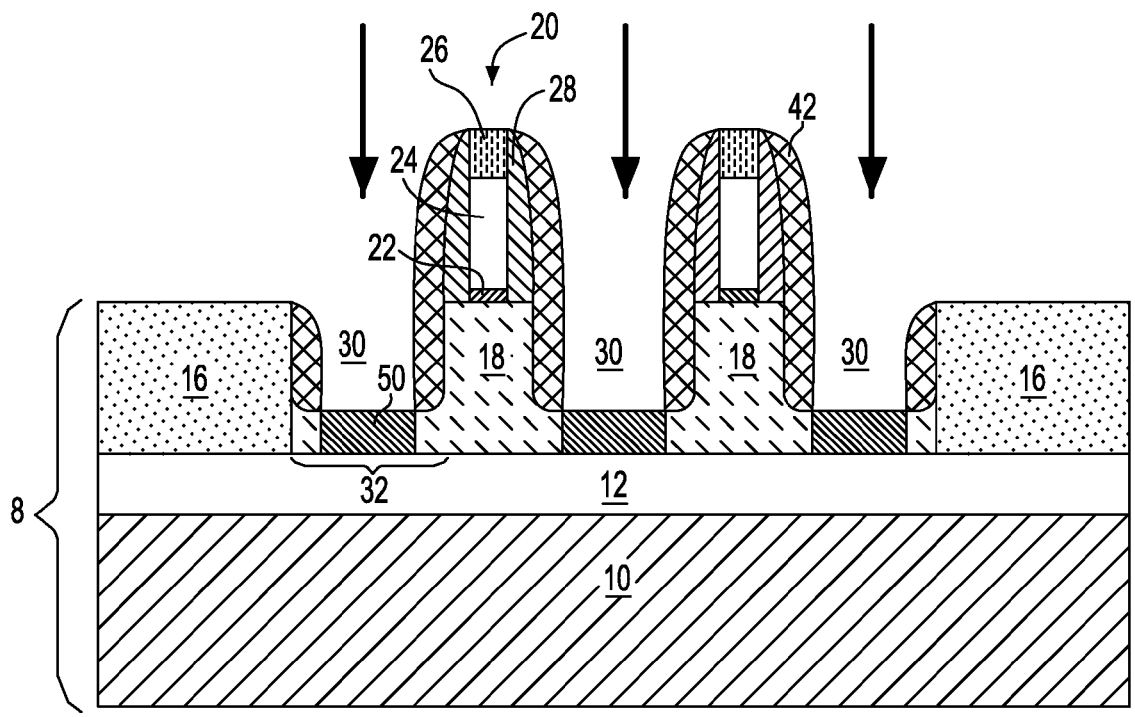
FIG. 5 is a cross-sectional view of the first exemplary semiconductor structure of FIG. 4 after forming doped regions through the bottom of the source/drain trenches and into a sublayer portion of the top semiconductor layer.

Referring to FIG. 5, there is illustrated the first exemplary semiconductor structure of FIG. 4 after forming doped regions 50 for junction butting. The doped regions 50 can be formed by vertical implanting dopants through a bottom portion of trenches 30A and into the implantation regions 34. In one embodiment, the doped regions 50 that are formed are in contact with the buried insulator layer 12. In some embodiments of the present disclosure, angled ion implantation can also be employed to ensure no un-implanted portions are present in the implantation regions 34. The sacrificial spacers 42 serve as an ion implantation mask to confine the ion implantation in the implantation regions 34 and to provide a better control over the subsequent lateral placement and spread of implanted dopants. For a pFET, the dopants are p-type. Examples of p-type dopants include, but are not limited to, B, Al, Ga or In. For an nFET, dopants are n-type. Examples of n-type dopants include, but are not limited to, P, As or Sb. In one embodiment, the dopant concentration of doped region 50 is $1 \times 10^{19}$ atoms/cm$^3$ or greater.

A thermal annealing step to activate dopants or heating caused by subsequent processes above 700° C. can laterally extend doped regions 50. The thermal annealing may be performed immediately after the ion implantation. Alternatively, no separate thermal annealing for the purpose of extending doped regions 50 is required due to subsequent thermal cycles, such as, for example, epitaxial deposition that will be described below.

Figure 6:
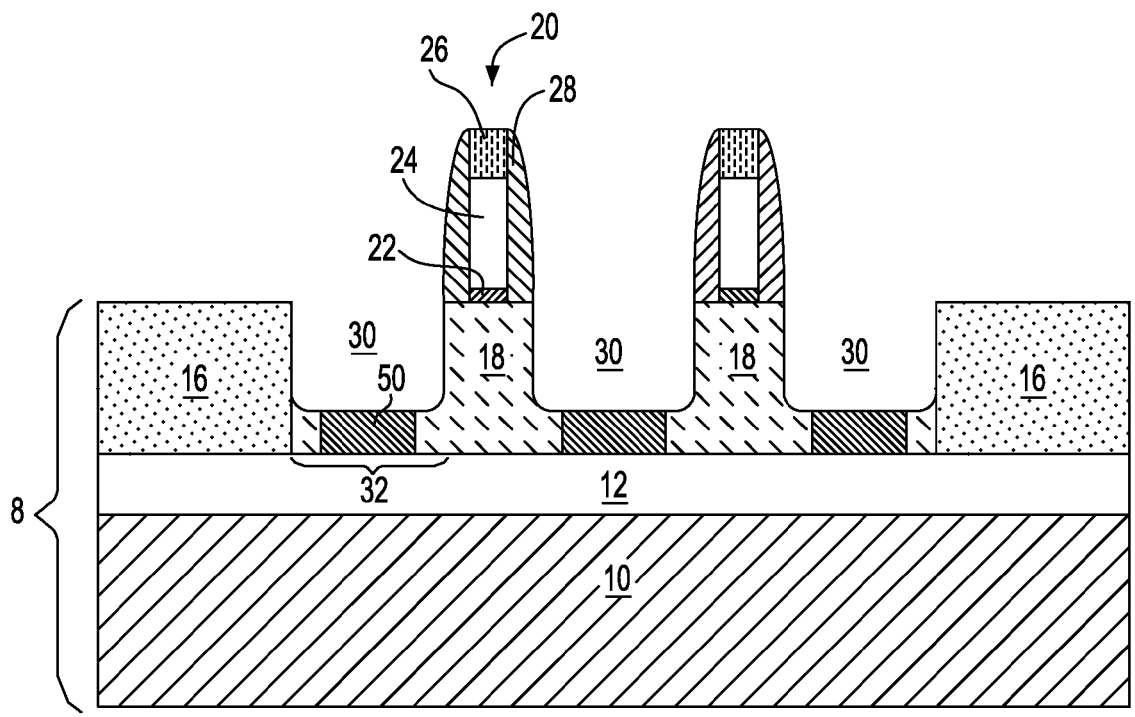
FIG. 6 is a cross-sectional view of the first exemplary semiconductor structure of FIG. 5 after removing the sacrificial spacers.

Referring to FIG. 6, there is illustrated the first exemplary semiconductor structure of FIG. 5 after removing sacrificial spacers 42. Upon removing the sacrificial spacers 42, the volume of the trenches is the same as that of the volume of trenches 30. The sacrificial spacers 42 can be removed with at least one etch that is selective to materials of the top semiconductor material layer 14, the STI regions 16, the gate dielectric 26 and the gate spacers 28.

Figure 7:
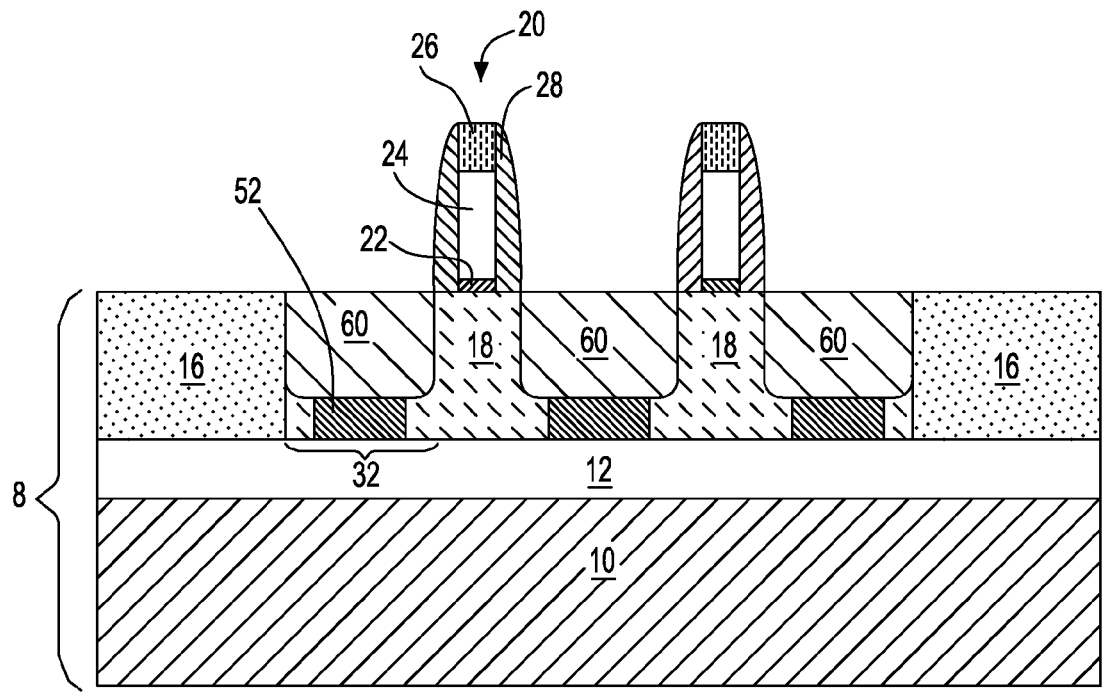
FIG. 7 is a cross-sectional view of the first exemplary semiconductor structure of FIG. 6 after forming epitaxial semiconductor regions in the source/drain trenches.

Referring to FIG. 7, there is illustrated the first exemplary semiconductor structure of FIG. 6 after forming epitaxial semiconductor regions 60 in the trenches 30. The epitaxial semiconductor regions 60 can be formed by filling trenches 30 with a semiconductor material utilizing an epitaxial growth process. In this case, the semiconductor material is deposited only on exposed semiconductor surfaces such as the doped regions 50 and the exposed surfaces of top semiconductor layer 14, and not on dielectric surfaces such as the surfaces of the gate cap dielectrics 26, the gate spacers 28 and the STI regions 16. It is noted that the epitaxial semiconductor region formed on one side of the gate structure 20 can form a source region of the disclosed semiconductor device, while the epitaxial semiconductor region on the other side of the gate structure can form a drain region of the disclosed semiconductor device.

The epitaxial growth of the semiconductor material can be effected by placing the first exemplary semiconductor structure of FIG. 6 into a reaction chamber, and simultaneously, or alternately, flowing at least one reactant gas (such as $SiH_4$, $Si_2H_6$, $SiH_2Cl_2$, $GeH_4$, $C_2H_2$, $C_2H_4$) and an etchant gas (such as HCl) into the reaction chamber. Optionally, a carrier gas such as $H_2$, $N_2$, $H_2$, and/or Ar can be flowed into the reaction chamber. The temperature for epitaxial deposition typically ranges from 550° C. to 1300° C. The apparatus for performing the epitaxial growth may include a CVD apparatus, such as atmospheric pressure CVD (APCVD), low pressure CVD (LPCVD) and PECVD.

The semiconductor material that can be epitaxially deposited includes any semiconductor material such as, for example, Si, SiGe and SiC. In one embodiment, when the semiconductor structure of the present disclosure is a pFET, the epitaxial semiconductor regions 60 are comprised of SiGe. In another embodiment, when the semiconductor structure of the present disclosure is an nFET, the epitaxial semiconductor regions 60 are comprised of SiC.

The semiconductor material of the epitaxial semiconductor regions 60 can be deposited as an intrinsic semiconductor material, or can be deposited with in-situ doping. If the semiconductor material is deposited as an intrinsic semiconductor material, the epitaxial semiconductor regions 60 can be subsequently doped (ex-situ) utilizing ion implantation, gas phase doping or dopant out diffusion from a sacrificial dopant source material. For a pFET, the epitaxial semiconductor regions 60 are doped with a p-type dopant and for an nFET, the epitaxial semiconductor regions 60 are doped with an n-type dopant.

The high temperatures involved in the epitaxial deposition process may result in a lateral diffusion of the implanted dopants where the doped regions 50 extend laterally to form extended doped regions 52. The length of the lateral diffusion of the implanted dopants during the epitaxial deposition is determined by parameters, such as, the dopant concentration in the doped regions 50 and the temperature and time taken to grow the epitaxial semiconductor regions 60. At this stage, the extended doped regions 52 are confined within the regions 32.

Figure 8:
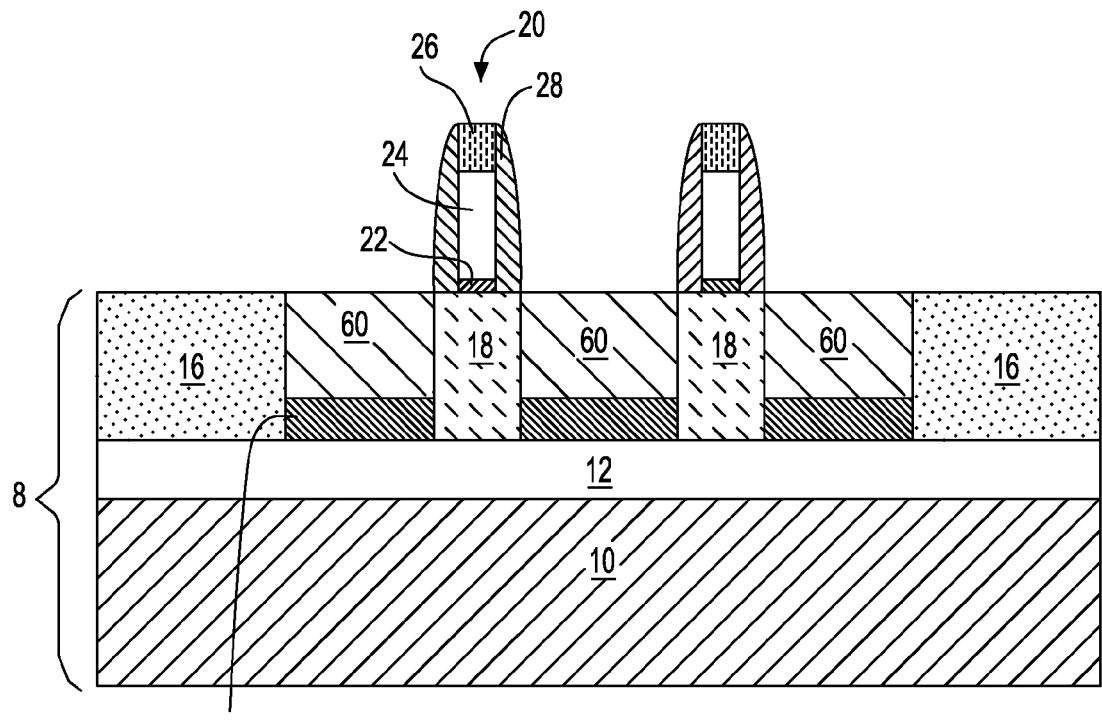
FIG. 8 is a cross-sectional view of the first exemplary semiconductor structure of FIG. 7 after forming junction butting regions underneath the epitaxial semiconductor regions.

Referring to FIG. 8, there is illustrated the first exemplary semiconductor structure of FIG. 7 after forming junction butting regions 54 underneath the epitaxial semiconductor regions 60. Subsequently, dopants in the extended doped regions 52 and the epitaxial semiconductor regions 60 are subjected to a dopant activation process. The dopants can be activated at a temperature between 700° C. and 1000° C. by, for example, a rapid thermal anneal (RTA) process. During the dopant activation process, the implanted dopants in the doped regions 50 further diffuse into undoped portions of regions 32 to form junction butting regions 54. In one embodiment, the junction butting regions 54 abut lower portions of the STI regions 16 and lower portions of the top semiconductor layer 14 underneath the gate structures 20. The junction butting regions 54 are also in contact portions of the buried insulator layer 12 that are located beneath the trenches 30. In one embodiment and as shown in FIG. 8, the junction butting region 54 can have sidewalls that are vertically aligned with the overlying sidewalls of the epitaxial semiconductor regions 60.

The junction butting regions 54 and overlying epitaxial semiconductor regions 60 at opposite sides of gate structures 20 together constitute embedded source/drain regions.

Figure 9:
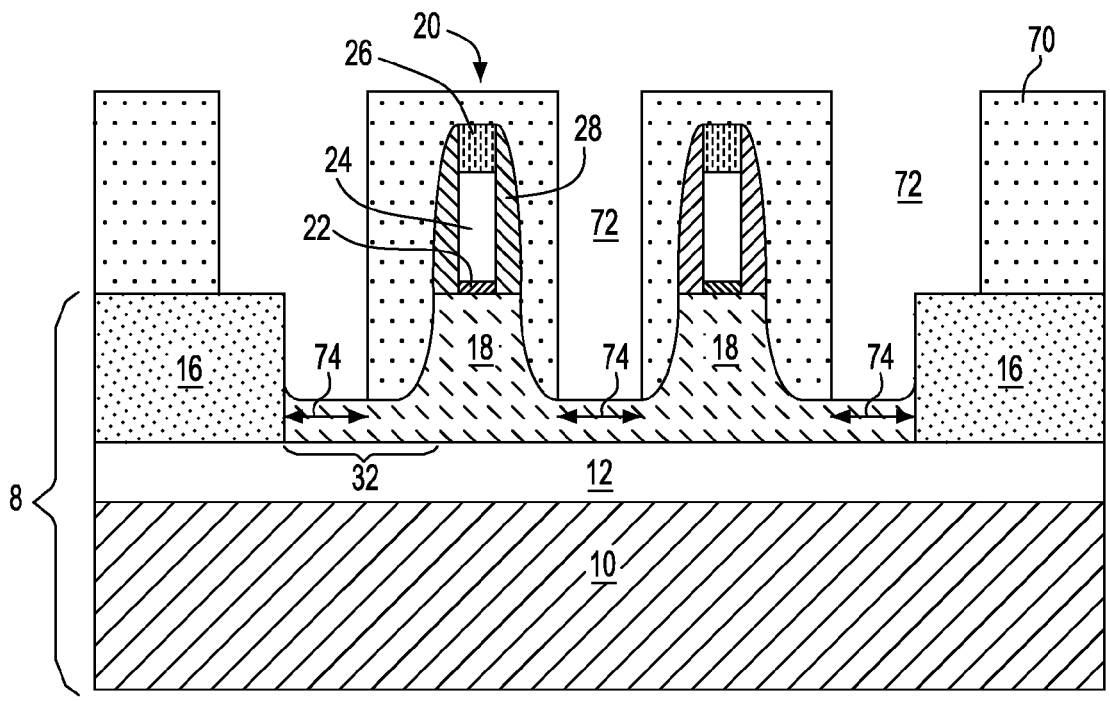
FIG. 9 is a cross-sectional view of a second exemplary semiconductor structure that can be derived from the semiconductor structure of FIG. 2 after forming openings in photoresist layer portions in accordance with an embodiment of the present disclosure.

Referring to FIG. 9, a second exemplary semiconductor structure can be derived from the semiconductor structure of FIG. 2 after forming openings 72 in photoresist layer portions 70. The openings 72 can be formed by patterning a photoresist layer (not shown) utilizing lithography so as to expose implantation regions 74 in regions 32 for subsequent ion implantation. The photoresist layer can be formed using a conventional deposition process, such as, for example, CVD, PECVD or spin-on coating. The implantation regions 74 are selected to be away from the channel regions 18. The widths of the implantation regions 74 that are defined by the photoresist layer portions 70 are selected such that dopants introduced therein during the subsequent ion implantation essentially do not diffuse into the channel regions 18 in the post epitaxial deposition and subsequent thermal cycles, i.e., the channel regions 18 are substantially free of the implanted dopants. As a result, short channel effects are suppressed.

Figure 10:
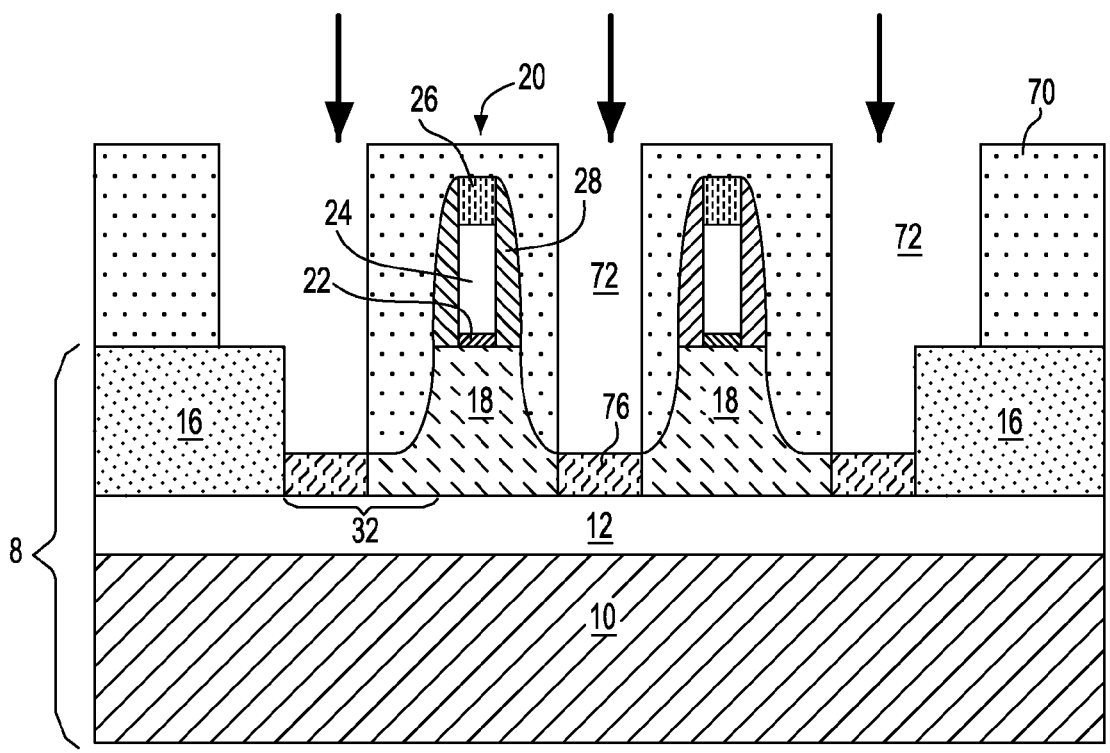
FIG. 10 is a cross-sectional view of the second exemplary semiconductor structure of FIG. 9 after forming doped regions through the bottom of the source/drain trenches and into a sublayer portion of the top semiconductor layer.

Referring to FIG. 10, there is illustrated the second exemplary semiconductor structure of FIG. 9 after forming doped regions 76. The processing steps of FIG. 5 can be performed to form the doped regions 76. In this case, the photoresist layer portions 70 and the STI regions 16 serve as an ion implantation mask to confine the ion implantation in the implantation regions 74 so as to provide a better control over the subsequent lateral placement and spread of implanted dopants.

Figure 11:
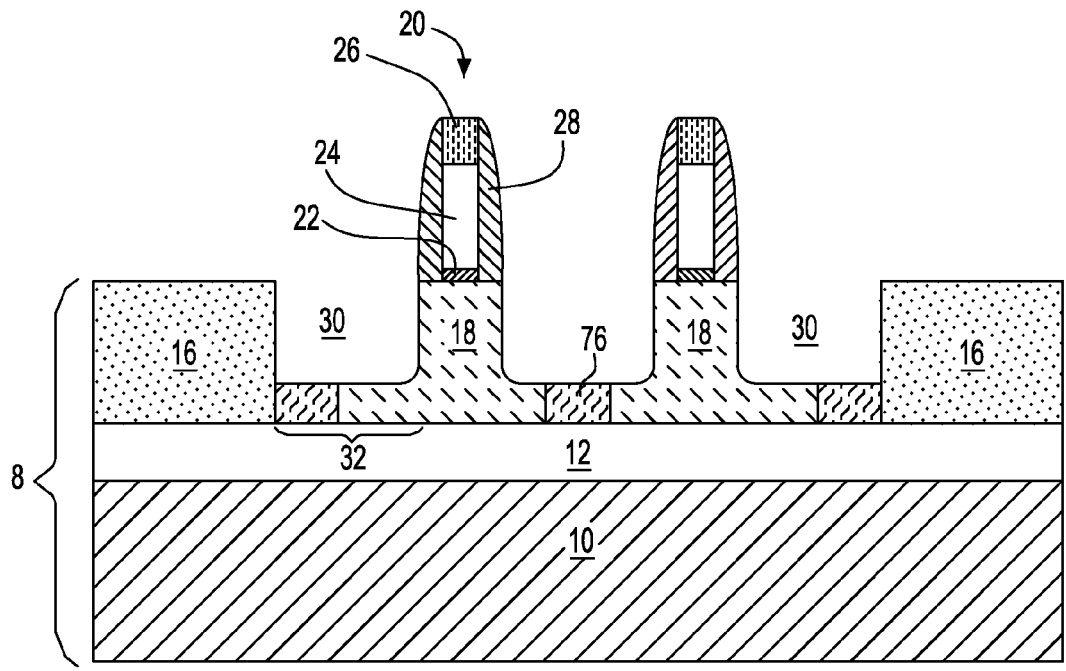
FIG. 11 is a cross-sectional view of the second exemplary semiconductor structure of FIG. 10 after removing the photoresist layer portions.

Referring to FIG. 11, there is illustrated the second exemplary semiconductor structure of FIG. 10 after removing the photoresist layer portions 70. The photoresist layer portions 70 can be removed, for example, by ashing to expose trenches 30.

Figure 12:
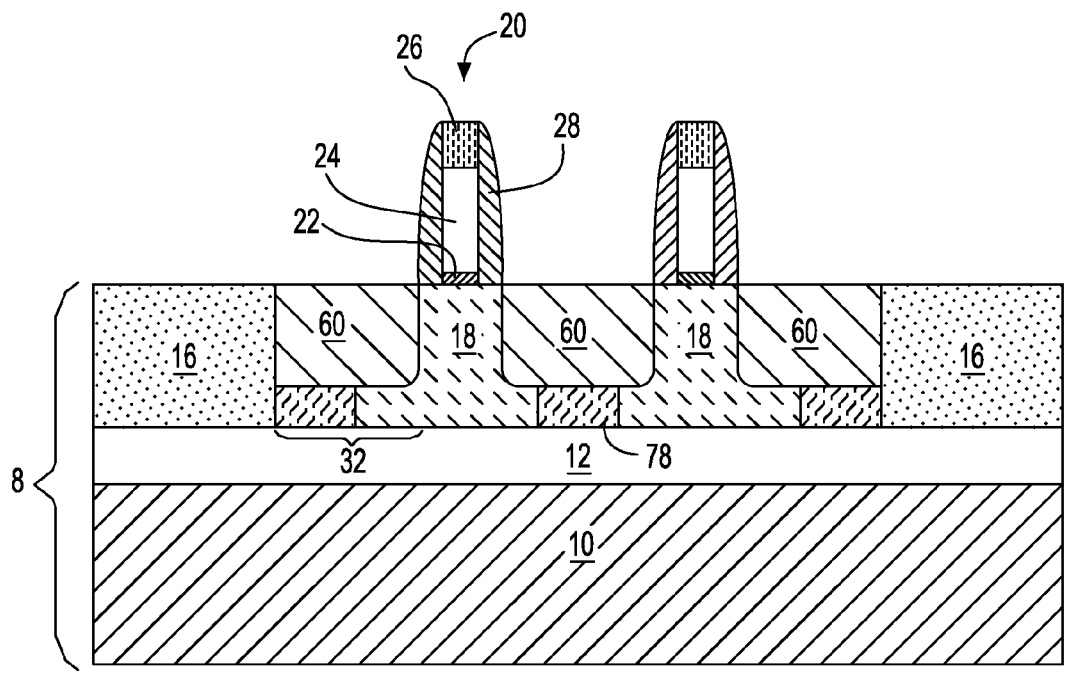
FIG. 12 is a cross-sectional view of the second exemplary semiconductor structure of FIG. 11 after forming epitaxial semiconductor regions in the source/drain trenches.

Referring to FIG. 12, there is illustrated the second exemplary semiconductor structure of FIG. 11 after forming epitaxial semiconductor regions 60 in the trenches 30. The epitaxial semiconductor regions 60 can be formed by the processing steps described above with respect to FIG. 7. The lateral diffusion of the implanted dopants during the epitaxial deposition process extends the doped regions 76 to form extended doped regions 78. At this stage, the extended doped regions 78 are confined within the regions 32.

Figure 13:
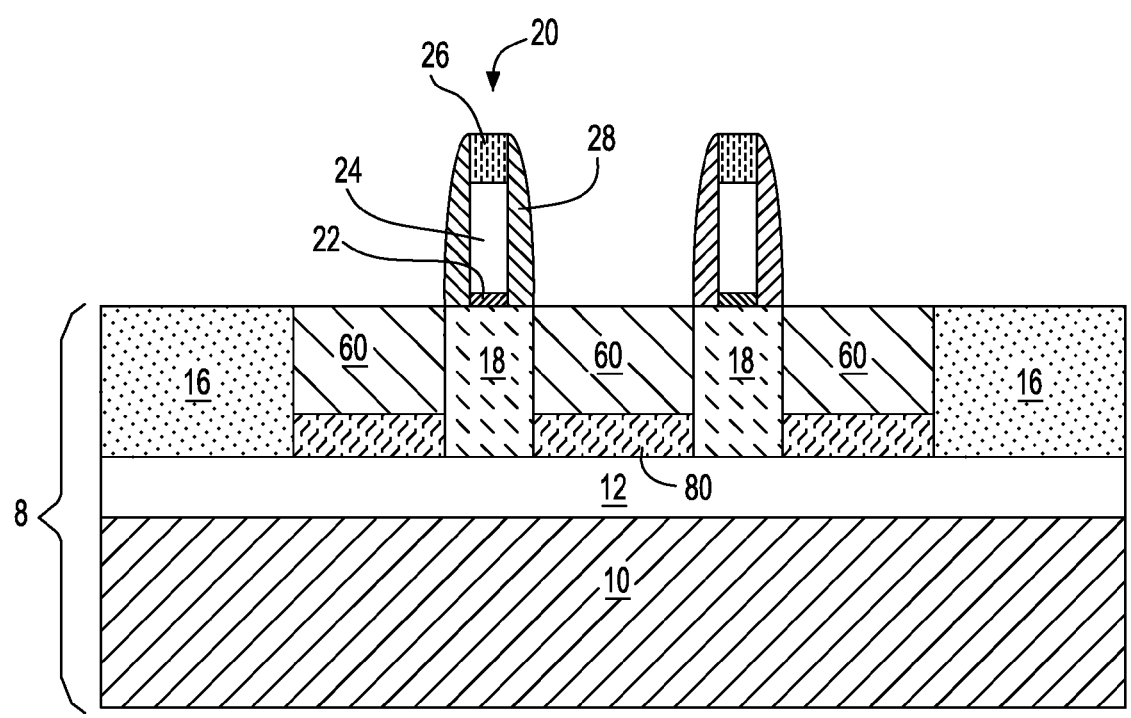
FIG. 13 is a cross-sectional view of the second exemplary semiconductor structure of FIG. 12 after forming junction butting regions underneath the epitaxial semiconductor regions.

Referring to FIG. 13, there is illustrated the second exemplary semiconductor structure of FIG. 12 after forming junction butting regions 80 underneath the epitaxial semiconductor regions 60. The junction butting regions 80 can be formed by the processing steps described above with respect to FIG. 8. In one embodiment, the junction butting regions 80 abuts lower portions of the STI regions 16 and lower portions of the top semiconductor layer 14 located beneath the gate structures 20. The junction butting regions 80 are also in contact with the entirety of portions of the buried insulator layer 12 that are located beneath the trenches 30. In one embodiment and as shown in FIG. 13, the junction butting region 80 can have sidewalls that are vertically aligned with the overlying sidewalls of the epitaxial semiconductor regions 60.

The junction butting regions 80 and overlying epitaxial semiconductor regions 60 at opposite sides of gate structures 20 together constitute embedded source/drain regions.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor structure comprising:
    forming a plurality of gate structures on a top semiconductor layer of a semiconductor-on-insulator (SOI) substrate;
    forming trenches in the top semiconductor layer between the gate structures, the trenches extending through a portion of the top semiconductor layer;
    forming sacrificial spacers on sidewalls of the gate structures and the trenches, the sacrificial spacers shielding portions of the top semiconductor layer underneath the sacrificial spacers;
    introducing dopants into un-shielded portions of the top semiconductor layer underneath the trenches to form doped regions in the top semiconductor layer, the doped regions contacting a buried insulator layer of the SOI substrate;
    removing the sacrificial spacers to expose undoped portions of the top semiconductor layer beneath the trenches; and
    forming doped epitaxial semiconductor regions in the trenches.

2. The method of claim 1, further comprising annealing the semiconductor structure to activate said dopants.

3. The method of claim 2, wherein during said forming epitaxial semiconductor regions and said annealing, the dopants in the doped regions diffuse laterally into the undoped portions of the top semiconductor layer underneath the trenches to provide junction butting regions, the junction butting regions abutting the buried insulator layer of the SOI substrate.

4. The method of claim 3, wherein the junction butting regions do not extend into channel regions of the SOI substrate that are located beneath the gate structures and between the doped epitaxial semiconductor regions such that the channel regions are substantially free of the dopants present in the junction butting regions.

5. The method of claim 1, wherein said forming the gate structures comprises:
    forming a stack of gate level layers on the top semiconductor layer of the SOI substrate;
    patterning the gate level layers to form gate stacks; and
    forming gate spacers on opposite sidewalls of each gate stack,
    wherein each gate stack and the gate spacers formed on opposite sidewall of the gate stack constitute the gate structure.

6. The method of claim 1, wherein said forming the sacrificial spacers comprises:
    conformally depositing a sacrificial spacer material layer over the gate structures and trenches; and
removing horizontal portions of the sacrificial spacer material layer.

7. The method of claim 1, wherein said introducing the dopants is performed by ion implantation.

8. The method of claim 1, wherein the doped epitaxial semiconductor regions and the doped regions include a same type of dopant.

9. The method of claim 1, wherein the sacrificial spacers comprises germanium, silicon germanium alloy or an organosilicate glass.

10. A method of forming a semiconductor structure comprising:
   forming a plurality of gate structures on a top semiconductor layer of a semiconductor-on-insulator (SOI) substrate;
   forming trenches in the top semiconductor layer between the gate structures, the trenches extending through a portion of the top semiconductor layer;
   forming a photoresist layer on the gate structures and the top semiconductor layer;
   forming openings in the photoresist layer, wherein the openings expose portions of the top semiconductor layer underneath the trenches, and wherein remaining portions of the photoresist layer space the openings laterally away from the gate structures;
   introducing dopants into the exposed portions of the top semiconductor layer to form doped regions in the top semiconductor layer, the doped regions contacting a buried insulator layer of the SOI substrate;
   removing the remaining portions of the photoresist layer; and
   forming doped epitaxial semiconductor regions in the trenches.

11. The method of claim 10, further comprising annealing the semiconductor structure to activate said dopants.

12. The method of claim 11, wherein during said forming the doped epitaxial semiconductor regions and said annealing, the dopants in the doped regions diffuse laterally into undoped portions of the top semiconductor layer underneath the trenches to provide junction butting regions, the junction butting regions abutting the buried insulator layer of the SOI substrate.

13. The method of claim 12, wherein the junction butting regions do not extend into the channel regions of the SOI substrate that are located beneath the gate structures and between the doped epitaxial semiconductor regions such that the channel regions are substantially free of the dopants present in the junction butting regions.

14. The method of claim 10, wherein said forming the gate structures comprises:
   forming a stack of gate level layers on the top semiconductor layer of the SOI substrate;
   patterning the gate level layers to form gate stacks; and
   forming gate spacers on opposite sidewalls of each gate stack,
   wherein each gate stack and the gate spacers formed on opposite sidewall of the gate stack constitute the gate structure.

15. The method of claim 10, wherein said introducing the dopants is performed by ion implantation.

16. The method of claim 10, wherein the doped epitaxial semiconductor regions and the doped regions include a same type of dopant.

17. A semiconductor structure, comprising:
   a plurality of gate structures on a top semiconductor layer of a semiconductor-on-insulator (SOI) substrate;
   epitaxial semiconductor regions located on opposite sides of the gate structures and over recessed portions of the top semiconductor layer, the epitaxial semiconductor regions comprising a first dopant; and
   junction butting regions located in the recessed portions of the top semiconductor layer underneath the epitaxial semiconductor regions and having bottom surfaces in contact with a buried insulator layer of the SOI substrate, the junction butting regions comprising a second dopant,
   wherein portions of the top semiconductor layer located beneath the gate structures and laterally surrounded by vertical stacks of the epitaxial semiconductor regions and the junction butting regions free of the second dopant present in the junction butting regions.

18. The semiconductor structure of claim 17, wherein the doped epitaxial semiconductor regions and the underlying junction butting regions define a source region and a drain region.

19. The semiconductor structure of claim 17, wherein the first dopant has a same polarity as the second dopant.

20. The semiconductor structure of claim 17, wherein the first dopant and the second dopant are a p-type dopant selected from group consisting of B, Al, Ga and In, or wherein the first dopant and the second dopant are an n-type dopant selected from group consisting of P, As and Sb.

* * * * *